(12) United States Patent
Liu et al.

(10) Patent No.: US 11,217,549 B2
(45) Date of Patent: Jan. 4, 2022

(54) DRIVING CHIP AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lianbin Liu, Beijing (CN); Hengzhen Liang, Beijing (CN); Chuanyan Lan, Beijing (CN); Guoqiang Wu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/756,976

(22) PCT Filed: Oct. 30, 2018

(86) PCT No.: PCT/CN2018/112564
§ 371 (c)(1),
(2) Date: Apr. 17, 2020

(87) PCT Pub. No.: WO2019/169879
PCT Pub. Date: Sep. 12, 2019

(65) Prior Publication Data
US 2020/0273831 A1    Aug. 27, 2020

(30) Foreign Application Priority Data

Mar. 5, 2018 (CN) .......................... 201820304616.1

(51) Int. Cl.
*H01L 23/00* (2006.01)

(52) U.S. Cl.
CPC ...... *H01L 24/14* (2013.01); *H01L 2224/1403* (2013.01)

(58) Field of Classification Search
CPC ... H01L 2/14; H01L 2224/1403; H01L 24/92; H01L 24/32; H01L 2224/83101;
(Continued)

(56) References Cited

U.S. PATENT DOCUMENTS

2004/0169291 A1   9/2004 Yang et al.
2009/0174832 A1*  7/2009 Lee .......................... G06F 3/045
                                                       349/43

(Continued)

FOREIGN PATENT DOCUMENTS

CN    101414583    4/2009
CN    101533816    9/2009
(Continued)

OTHER PUBLICATIONS

International Search Report from PCT/CN2018/112564 dated Jan. 30, 2019.
Written Opinion from PCT/CN2018/112564 dated Jan. 30, 2019.

*Primary Examiner* — Nelson Garces
*Assistant Examiner* — Sue Tang
(74) *Attorney, Agent, or Firm* — Calfee, Halter & Griswold LLP

(57) ABSTRACT

A driving chip and a display device are provided herein. The driving chip includes a substrate, a plurality of connection bumps and a plurality of buffer bumps on the substrate. Each of the connection bumps and the buffer bumps is disposed on a first substrate of the substrate. The buffer bump includes a first end face with a height a, and the connection bump has a connection bump end face with a height b, a<b. The height is a distance from a corresponding end face of the connection bump or the buffer bump to the first surface. With the buffer bumps on the driving chip, stress buffering can be (Continued)

achieved, which can further improve the bonding effect of the driving chip.

18 Claims, 2 Drawing Sheets

(58) Field of Classification Search
CPC .............. H01L 24/81; H01L 24/83; H01L 2224/14154; H01L 2224/14151; H01L 2224/14177; H01L 24/13; H01L 2224/16227; H01L 2224/32225; H01L 2224/13019; H01L 2224/13017; H01L 24/16; H01L 2224/9211; H01L 2224/81903; H01L 2224/81203; H01L 2224/83203; H01L 2224/83851; H01L 2224/14051; H01L 23/00; H01L 24/14; G09F 9/30

See application file for complete search history.

(56) References Cited

U.S. PATENT DOCUMENTS

| | | | |
|---|---|---|---|
| 2009/0262293 | A1* | 10/2009 | Kim ............... G02F 1/13394 349/156 |
| 2013/0308084 | A1* | 11/2013 | Niwano ............ G02F 1/1339 349/155 |
| 2015/0091163 | A1 | 4/2015 | Kim |
| 2019/0148327 | A1 | 5/2019 | Chen et al. |
| 2020/0273831 | A1 | 8/2020 | Liu et al. |

FOREIGN PATENT DOCUMENTS

| | | |
|---|---|---|
| CN | 107621710 | 1/2018 |
| CN | 207800043 | 8/2018 |

\* cited by examiner

DRIVING CHIP AND DISPLAY DEVICE

RELATED APPLICATION

The present application is a 35 U.S.C. 371 national stage application of a PCT International Application No. PCT/CN2018/112564, filed on Oct. 30, 2018, which claims the benefit of Chinese Patent Application No. 201820304616.1, filed on Mar. 5, 2018, the entire disclosure of which is incorporated herein by reference.

TECHNICAL FIELD

The present disclosure relates to the field of display technologies, specifically to a driving chip and a display device.

BACKGROUND

Flexible substrates are more and more widely used in display devices due to their characteristics such as lightness, thinness, good impact resistance, etc. During the process of manufacturing such a display device, generally, a flexible substrate is firstly fixed on a glass substrate, and then subsequent processes for manufacturing a flexible display panel are performed. During this process, a driver integrated circuit (Driver IC) needs to be bonded to the display panel, and the display panel is driven by the driver integrated circuit so that the display panel displays images.

SUMMARY

An embodiment of the present application provides a driving chip comprising: a substrate, and a plurality of connection bumps and a plurality of buffer bumps on a first surface of the substrate. A buffer bump of the plurality of buffer bumps comprises a first end face with a height a, a connection bump of the plurality of connection bumps comprises a connection bump end face with a height b, $a<b$. The height a is a distance from the end face of the buffer bump to the first surface, the height b is a distance from the connection bump end face of the connection bump to the first surface.

In some embodiments, at least one of the plurality of buffer bumps further comprises a second end face with the height b.

In some embodiments, the plurality of buffer bumps comprise a stepped bump, and the first end face and the second end face form a stepped surface of the stepped bump.

In some embodiments, the plurality of buffer bumps comprise a first sub-bump with the height a and a second sub-bump with the height b, the first sub-bump and the second sub-bump are independent of each other.

In some embodiments, at least some buffer bumps of the plurality of buffer bumps are arranged between adjacent connection bumps of the plurality of connection bumps.

In some embodiments, at least some of the plurality of buffer bumps and at least some of the plurality of connection bumps are arranged alternately on the first surface of the substrate.

In some embodiments, $b/3 \leq a < 2b/3$.

In some embodiments, the plurality of buffer bumps are uniformly arranged on the first surface of the substrate.

In some embodiments, at least a group of connection bumps among the plurality of connection bumps are arranged on a same straight line in a first direction, and the plurality of buffer bumps comprise at least a group of buffer bumps arranged on the same straight line in the first direction.

In some embodiments, a distance between adjacent buffer bumps of the at least some buffer bumps is equal to a minimum among distances between adjacent connection bumps of the plurality of connection bumps.

Another embodiment of the application provides a display device comprising the driving chip according to any one of the foregoing embodiments.

Other features and advantages of these embodiments will be explained in the following specific embodiments. In addition, in case of no confliction, the technical features in the embodiments described above may be combined in any manner to form other different embodiments, and these different embodiments also fall within the protection scope of the present application.

BRIEF DESCRIPTION OF DRAWINGS

The drawings are intended to provide a further understanding to the technical solutions of embodiments of the application, and constitute a part of the specification, which are used to illustrate the present disclosure together with specific embodiments below and do not limit the scope of the present application.

DETAILED DESCRIPTION OF EMBODIMENTS

Embodiments of the application will be described in detail below with reference to the drawings. It is to be noted that, in case of no confliction, embodiments disclosed herein and the features in the embodiments can be combined arbitrarily with each other.

Figure 1:
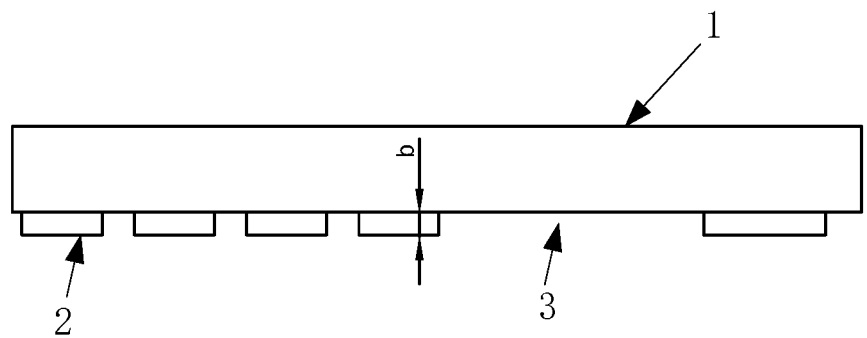
FIG. 1 is a schematic view of an example of a driving chip known to inventors of the present application.

During the bonding process of a driving integrated circuit, connection bumps on a back of the driving integrated circuit need to be brought into contact with metal leads exposed on the display panel to realize corresponding electrical connections. In the example of FIG. 1, connection bumps on the back of the driving integrated circuit have the same height. Inventors of the present application have found that in this case, during the bonding process of the driving integrated circuit, different regions of the driving integrated circuit will be subjected to different stresses, which is likely to cause poor bonding effect. Moreover, the display panel is prone to display abnormalities and even breakage.

Specifically, a driving chip shown in FIG. 1 comprises a substrate 1 and a plurality of connection bumps 2 on a first surface of the substrate 1. There is a large blank region 3 between the connection bumps 2 and the connection bumps 2 all have a height of b. During the bonding process of the driving integrated circuit, multiple regions of the driving integrated circuit are subjected to different stresses. For example, the regions provided with the connection bumps 2 of the same height and the blank region 3 are subjected to different stresses, thus poor bonding effect is likely to occur.

At the same time, the display panel is prone to display abnormalities and even breakage.

Figure 2:
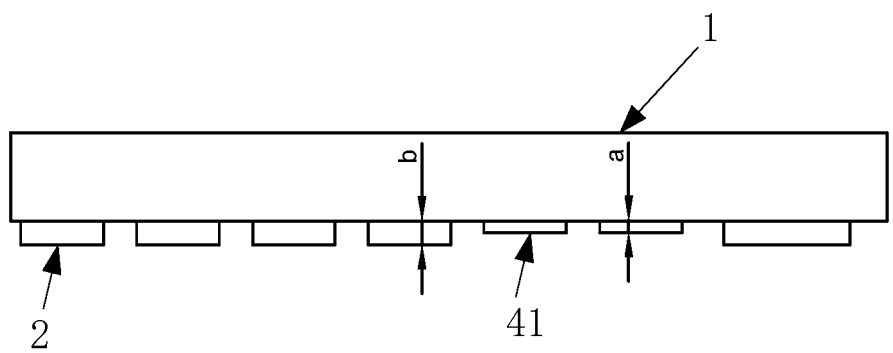
FIG. 2 is a schematic view of a driving chip provided by an embodiment of the present disclosure.

As shown in FIG. 2 which illustrates a driving chip provided by an embodiment of the application, the driving chip comprises a substrate 1 and a plurality of connection bumps 2 on the substrate 1. The driving chip is further provided with a plurality of buffer bumps. The buffer bump has a first end face 41 with a height a, and the connection bump 2 has an end face with a height b, a<b, the height mentioned above is specifically a distance from the end face to a surface of the substrate 1.

With the buffer bump having the first end face 41, a stress buffering effect can be achieved. During the bonding process, the display panel may firstly come into contact with the end face of the connection bump 2, and as the pressure increases, the display panel then comes into contact with the first end face 41 of the buffer bump. As a result, contact surfaces of different heights are generated, a technical effect of stress buffering can be achieved, thereby effectively improving the bonding effect.

In some embodiments, the buffer bumps are disposed in the blank region 3 on the substrate 1. By disposing the buffer bumps in the blank region 3, it is possible to effectively reduce the stress differences between different regions of the driving integrated circuit, especially the stress difference between the region having the connection bumps 2 of the same height and the blank region 3, which can further improve the bonding effect.

In some embodiments, the relationship between the height a of the buffer bump and the height b of the connection bump 2 is: $b/3 \leq a < 2b/3$.

In some embodiments, the height a of the first end face 41 of the buffer bump is half of the height of the connection bump 2, that is, a=b/2. In this case, it is possible to effectively prevent the height difference between the end faces of the buffer bump and the connection bump 2 from being too large or too small, which further improves the buffering effect of the buffer bumps.

In some embodiments, the driving integrated circuit is bonded to the display panel by an anisotropic conductive film (ACF) hot-pressing process.

A driving chip provided by another embodiment of the application has a main structure similar to that of the foregoing embodiment, i.e., it comprises a substrate 1, connection bumps 2, and buffer bumps. Regarding the main structure of the driving chip, reference can be made to the detailed description in the foregoing embodiment, and the difference therebetween will be explained.

Figure 3:
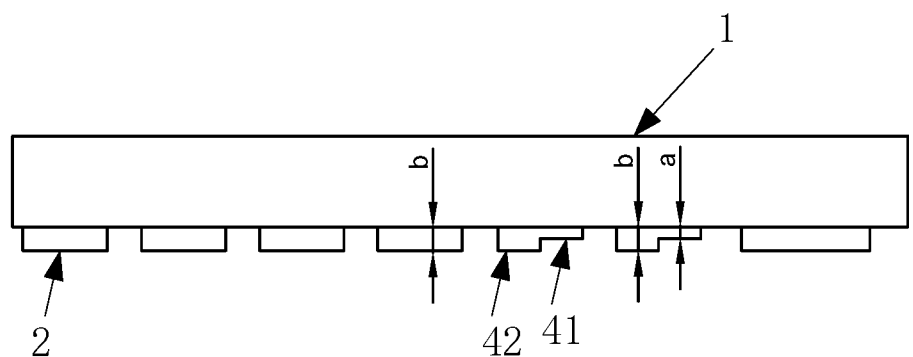
FIG. 3 is a schematic view of a driving chip provided by another embodiment of the present disclosure.

As shown in FIG. 3, the buffer bump of the driving chip according to another embodiment further comprises a second end face 42 with a height b. That is, the buffer bumps in this embodiment comprise a first end face with a height a and a second end face with a height b. In this way, during the process of bonding the driving chip to the display panel, the stress that the driving integrated circuit is subject to in the initial stage of coming into contact with the display panel may be more uniform, which can more effectively overcome the defect of stress difference in the blank region 3 resulting from the absence of bumps, and further improve the bonding effect of the driving integrated circuit.

The buffer bump in this embodiment comprises a stepped bump, and the stepped bump comprises stepped surfaces with heights a and b, that is, the buffer bump is an integrated structure with a first end face 41 and a second end face 42, as shown in FIG. 3. The stepped bump provided by this embodiment of the application can achieve the technical effect of gradual buffering. Furthermore, the buffer bump of an integrated structure has advantages of being easy to manufacture and assemble.

According to some embodiments of the application, the connection bumps 2 of the driving chip comprise at least a group of connection bumps arranged along a same straight line in a first direction, and the buffer bumps comprise at least a group of buffer bumps arranged along the same straight line in the first direction. For example, in the example of FIG. 3, the substrate 1 is provided with five connection bumps 2 arranged in the first direction, and a large blank region 3 exists between the fourth bump and the fifth bump. The blank region 3 is provided with two buffer bumps. The buffer bumps and the aforementioned five connection bumps 2 are arranged in the same direction and on the same straight line. The buffer bumps and the connection bumps 2 arranged along the same direction and on the same straight line further ensure a uniform distribution of the stress on the driving integrated circuit.

In some embodiments, a distance between adjacent buffer bumps is equal to a minimum value among the distances between adjacent connection bumps 2, which can further improve the uniform distribution of the stress on the driving integrated circuit.

Figure 4:
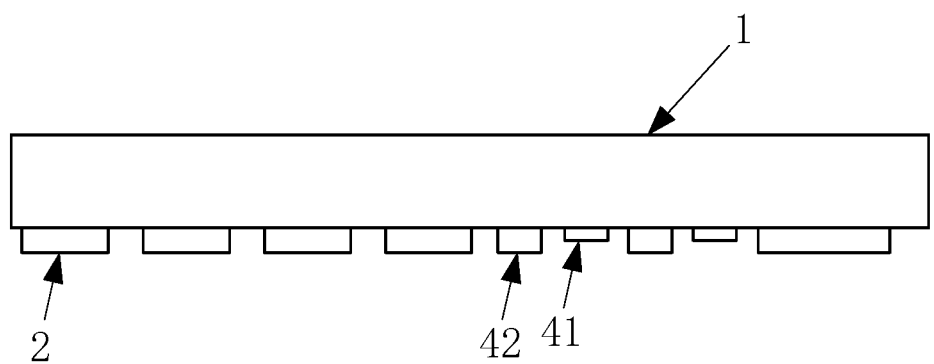
FIG. 4 is a schematic view of a driving chip provided by a further embodiment of the present disclosure.

According to a further embodiment of the application, as shown in FIG. 4, the buffer bump comprises a first sub-bump with a height a and a second sub-bump with a height b. The first sub-bump and the second sub-bump are arranged independently of each other. That is, the first sub-bump has a first end face 41 with a height a, and the second sub-bump has a second end face 42 with a height b.

During the process of bonding the driving chip to the display panel, the buffer bump comprising two independent sub-bumps of different heights can effectively avoid a phenomenon of stress concentration at the step of the integrated buffer bump previously described, effectively overcoming the defect of stress concentration at the joint of the first end face and the second end face of the integrated buffer bump. The above independently arranged sub-bumps may achieve a more flexible application, which can further improve the bonding effect of the driving integrated circuit.

In some embodiments, the buffer bumps are uniformly disposed on the substrate 1. The uniformly arranged buffer bumps can effectively ensure the uniform distribution of the stress on the driving integrated circuit, and can further effectively improve the bonding effect of the driving integrated circuit.

According to yet another embodiment of the present application, the buffer bump of the driving chip may be disposed between the connection bumps 2 to achieve a technical effect of stress buffering on regions between the connection bumps 2. In particular, when the spacing between adjacent connection bumps 2 is too large, arranging a buffer bump between adjacent connection bumps 2 can achieve a good effect of stress buffering. Similarly, the buffer bumps may also be disposed in the blank region 3 on the substrate 1. Similar to the embodiments described above, the technical effect of stress buffering for the driving integrated circuit in the blank region 3 can be effectively improved.

Figure 5:
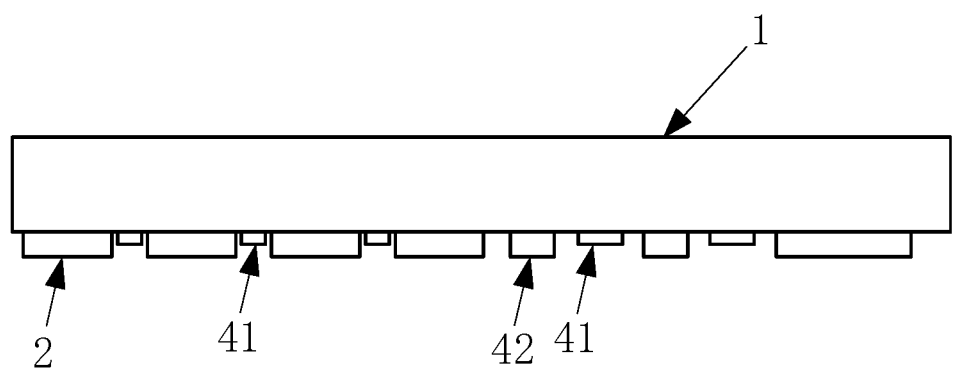
FIG. 5 is a schematic view of a driving chip provided by yet another embodiment of the present disclosure.

As shown in FIG. 5, the buffer bumps of the driving chip comprise buffer bumps between the connection bumps 2 and buffer bumps disposed in the blank region 3 on the substrate 1. At least some buffer bumps of the plurality of buffer bumps and at least some connection bumps of the plurality of connection bumps are arranged alternately on the first surface of the substrate. For this embodiment, stress buffering between the connection bumps 2 can be realized, and the technical effect of stress buffering on the blank region 3 of the driving integrated circuit can also be achieved, which can effectively improve the bonding effect of the driving integrated circuit.

Another embodiment of the present application provides a display device comprising the driving chip described in any one of the foregoing embodiments.

In the specification of the present application, the terms "dispose", "connect", "connection", "fix" and the like should be understood in a broad sense. For example, "connection" may be a fixed connection, a detachable connection, or an integrated connection; and may be a direct connection, or an indirect connection through an intermediate medium. For a person having an ordinary skill in the art, specific meanings of the above terms in the specification may be understood based on specific situations.

In addition, the descriptions of the terms "an embodiment", "some embodiments", "specific embodiments" and the like mean that specific features, structures, materials, or characteristics described in conjunction with the embodiments or examples are included in at least one embodiment or example of the application. In this specification, schematic expressions of the above terms do not necessarily refer to the same embodiment or example. Furthermore, the specific features, structures, materials, or characteristics described may be combined in a suitable manner in any one or more embodiments or examples.

Those skilled in the art should understand that the contents described in this specification are only intended to facilitate understanding of embodiments of the application, rather than limit the number of possible embodiments of the application. Any person skilled in the art can make any modifications and variations to these embodiments without departing from the spirit and scope revealed herein. The scope of protection sought by this application should be defined by the appended claims.

The invention claimed is:

1. A driving chip comprising:
   a substrate, and
   a plurality of connection bumps and a plurality of buffer bumps on a first surface of the substrate,
   wherein a buffer bump of the plurality of buffer bumps comprises a first end face with a height a, a connection bump of the plurality of connection bumps comprises a connection bump end face with a height b, a<b, wherein the height a is a distance from the end face of the buffer bump to the first surface, the height b is a distance from the connection bump end face of the connection bump to the first surface,
   wherein at least one of the plurality of buffer bumps further comprises a second end face with the height b.

2. The driving chip according to claim 1, wherein the plurality of buffer bumps comprise a stepped bump, and the first end face and the second end face form a stepped surface of the stepped bump.

3. The driving chip according to claim 1, wherein the plurality of buffer bumps comprise a first sub-bump with the height a and a second sub-bump with the height b, the first sub-bump and the second sub-bump are independent of each other.

4. The driving chip according to claim 1, wherein at least some buffer bumps of the plurality of buffer bumps are arranged between adjacent connection bumps of the plurality of connection bumps.

5. The driving chip according to claim 4, wherein a distance between adjacent buffer bumps of the at least some buffer bumps is equal to a minimum among distances between adjacent connection bumps of the plurality of connection bumps.

6. The driving chip according to claim 1, wherein at least some of the plurality of buffer bumps and at least some of the plurality of connection bumps are arranged alternately on the first surface of the substrate.

7. The driving chip according to claim 1, wherein $b/3 \leq a < 2b/3$.

8. The driving chip according to claim 1, wherein the plurality of buffer bumps are uniformly arranged on the first surface of the substrate.

9. The driving chip according to claim 1, wherein at least a group of connection bumps among the plurality of connection bumps are arranged on a same straight line in a first direction, and the plurality of buffer bumps comprise at least a group of buffer bumps arranged on the same straight line in the first direction.

10. A display device comprising the driving chip according to claim 1.

11. The display device according to claim 10, wherein at least one of the plurality of buffer bumps further comprises a second end face with the height b.

12. The display device according to claim 11, wherein the plurality of buffer bumps comprise a stepped bump, and the first end face and the second end face form a stepped surface of the stepped bump.

13. The display device according to claim 11, wherein the plurality of buffer bumps comprise a first sub-bump with the height a and a second sub-bump with the height b, the first sub-bump and the second sub-bump are independent of each other.

14. The display device according to claim 10, wherein at least some buffer bumps of the plurality of buffer bumps are arranged between adjacent connection bumps of the plurality of connection bumps.

15. The display device according to claim 10, wherein at least some of the plurality of buffer bumps and at least some of the plurality of connection bumps are arranged alternately on the first surface of the substrate.

16. The display device according to claim 10, wherein $b/3 \leq a < 2b)/3$.

17. The display device according to claim 10, wherein the plurality of buffer bumps are uniformly arranged on the first surface of the substrate.

18. The display device according to claim 10, wherein at least a group of connection bumps among the plurality of connection bumps are arranged on a same straight line in a first direction, and the plurality of buffer bumps comprise at least a group of buffer bumps arranged on the same straight line in the first direction.

* * * * *